(12) United States Patent
Kudo et al.

(10) Patent No.: US 7,948,424 B2
(45) Date of Patent: May 24, 2011

(54) RADIO WAVE ABSORBER AND PRODUCING METHOD THEREOF

(75) Inventors: Toshio Kudo, Amagasaki (JP); Toshio Uchida, Tokyo (JP); Akira Inoue, Tokyo (JP); Kazuaki Yagi, Tokyo (JP)

(73) Assignees: Mitsubishi Cable Industries, Ltd., Tokyo (JP); Asahi Building-Wall Co., Ltd., Tokyo (JP); Asahi Fiber Glass Co., Ltd., Tokyo (JP)

( * ) Notice: Subject to any disclaimer, the term of this patent is extended or adjusted under 35 U.S.C. 154(b) by 191 days.

(21) Appl. No.: 12/438,358

(22) PCT Filed: Aug. 23, 2007

(86) PCT No.: PCT/JP2007/066369
§ 371 (c)(1),
(2), (4) Date: Feb. 20, 2009

(87) PCT Pub. No.: WO2008/023764
PCT Pub. Date: Feb. 28, 2008

(65) Prior Publication Data
US 2010/0182188 A1     Jul. 22, 2010

(30) Foreign Application Priority Data
Aug. 23, 2006   (JP) .................................. 2006-227029

(51) Int. Cl.
*H01Q 17/00* (2006.01)

(52) U.S. Cl. .............................................. 342/1; 428/87
(58) Field of Classification Search ................... 342/1–4
See application file for complete search history.

(56) References Cited

U.S. PATENT DOCUMENTS

| | | | | |
|---|---|---|---|---|
| 4,442,139 A * | 4/1984 | Brigham | ....................... | 427/122 |
| 5,519,168 A * | 5/1996 | Owens | ........................... | 174/393 |
| 2001/0003358 A1* | 6/2001 | Terase et al. | ..................... | 252/62 |
| 2002/0148626 A1* | 10/2002 | Matsumura et al. | ........ | 174/35 R |
| 2006/0251203 A1* | 11/2006 | Okamura et al. | ............. | 376/287 |
| 2007/0166562 A1* | 7/2007 | Swei et al. | .................... | 428/500 |

FOREIGN PATENT DOCUMENTS

| | | |
|---|---|---|
| JP | 02-091997 | 3/1990 |
| JP | 05-335832 | 12/1993 |
| JP | 2000-307286 | 11/2000 |
| JP | 2000307286 A * | 11/2000 |
| JP | 2001-322194 | 11/2001 |
| JP | 2003-086988 | 3/2003 |
| JP | 2005-183883 | 7/2005 |
| WO | WO 2004084234 A1 * | 9/2004 |

* cited by examiner

*Primary Examiner* — Thomas H Tarcza
*Assistant Examiner* — Timothy A Brainard
(74) *Attorney, Agent, or Firm* — Patrick J. S. Inouye (57) ABSTRACT

In order to provide a radio wave absorber that can be produced easily and has excellent radio wave absorption characteristics, a conductive surface 2 of a conductive paint 6 is formed on one surface 1*a* of a mat-shaped inorganic fiber bulk material 1.

13 Claims, 6 Drawing Sheets

RADIO WAVE ABSORBER AND PRODUCING METHOD THEREOF

CROSS-REFERENCE TO RELATED APPLICATIONS

This patent application is the U.S. National Phase patent application under 35 U.S.C. §371 of International Application No. PCT/JP2007/066369, filed on Aug. 23, 2007, which in turn claims the benefit of Japanese Patent Application No. 2006-227029, filed on Aug. 23, 2006, the disclosures of which are incorporated by reference herein.

TECHNICAL FIELD

The present invention relates to a radio wave absorber and producing method thereof.

BACKGROUND ART

In general, radio wave absorbers are arranged on the walls and ceilings of anechoic chambers in which product testing is performed on an electronic product or the like. Besides the radio wave absorbers in pyramid or conical shapes, examples include a sonic wave/radio having a radio absorption layer formed by making a conductive paint adhere to glass fiber in a mat shape with a sonic wave absorption layer laid thereover (see, for example, Patent Document 1). A λ/4 type radio wave absorber has been also known, which is formed by inserting a dielectric layer between a resistance film and a radio wave reflector for selectively absorbing a radio wave at a specified frequency (see, for example, Patent Document 2)

Patent Document 1: Japanese Unexamined Patent Application Publication 2003-86988

Patent Document 2: Japanese Unexamined Patent Application Publication 5-335832

DISCLOSURE OF THE INVENTION

Problems that the Invention is to Solve

Recently, electronic appliances that produce radio wave, that is, an electromagnetic wave, such as personal computers, mobile phones, and the like, are increasing in use, and therefore, indoor installation of a radio wave absorber, such as a radio wave absorption wall, is in demand in buildings, residential premises, and the like, for preventing radio wave interference, malfunction of electronic appliances, and the like, caused due to the presence of the radio wave produced therefrom.

Where any of the aforementioned radio wave absorbers is used as a radio wave absorber arranged on the indoor wall or ceiling of an office building or a residential house in which, for instance, a wireless LAN system is introduced, the following problems can occur:

(i) Referring to the sonic wave/radio wave absorber disclosed in Patent Document 1, the radio wave absorption layer is formed in such a manner that water in which a conductive paint is dispersed is impregnated in a glass fiber layer and is dried to adhere to the entire glass fiber. This absorber requires a large amount of the conductive paint, and impregnation of a large amount of the paint increases the density of the resultant absorber to lead to impaired heat insulating characteristics and acoustic absorbing characteristics.

Further, formation of the fiber layer with the use of continuous glass fiber increases processing labor and cost.

(ii) The λ/4 type radio wave absorber disclosed in Patent Document 2 must be compact and thin for effectively utilizing the indoor space where the absorber is installed indoors. In addition, the radio wave absorption film is made to adhere to the surface by sputtering, and therefore, the film may result in insufficient radio wave absorption characteristics.

As such, an objective of the present invention is to provide a radio wave absorber, which can be produced easily and which has excellent radio wave absorption characteristics, and a method for producing the radio wave absorber.

Means for Solving the Problems

To attain the above objective, a radio wave absorber in accordance with one embodiment includes: a mat-shaped inorganic fiber bulk material; and a conductive surface formed by making a conductive paint adhere spottily to one surface of the mat-shaped inorganic fiber bulk material so as to be non-uniform in thickness.

In accordance with a further embodiment, a radio wave absorber includes: a mat-shaped inorganic fiber bulk material; and a conductive surface formed by making a conductive paint adhere to one surface of the mat-shaped inorganic fiber bulk material by spraying, wherein a resistance between two arbitrary points substantially 50 mm apart from each other on the conductive surface is set in a range substantially between 300Ω and 10 kΩ, both inclusively.

The conductive paint can be a graphite-based conductive paint, and an adhering amount of the conductive paint is set to the one surface in a range substantially between 5 g/m² and 60 g/m², both inclusively.

Preferably, the conductive paint adheres to the one surface of the mat-shaped inorganic fiber bulk material to be distributed in the range substantially between 0.5 mm and 2.5 mm, both inclusively, in depth from the one surface toward a center in the thickness direction.

The mat-shaped inorganic fiber bulk material is made of a material selected from the group consisting of glass wool, rock wool, and ceramic wool.

A protection layer may be laid over the conductive surface.

A radio wave absorber producing method in accordance with one embodiment includes: spraying by a sprayer a conductive paint of a predetermined amount to adhere to one surface of a mat-shaped inorganic fiber bulk material; and drying the adhering conductive paint to form a conductive surface having a resistance between two arbitrary points substantially 50 mm apart from each other thereon in a range substantially between 300Ω and 10 kΩ, both inclusively.

Preferably, the conductive paint of graphite base is sprayed by the sprayer onto the one surface to adhere thereto to an amount in a range substantially between 5 g/m² and 60 g/m², both inclusively.

Preferably, during time from adhesion of the conductive paint to formation of the conductive surface, the mat-shaped inorganic fiber bulk material is not pressed substantially.

ADVANTAGES OF THE INVENTION

The present invention can exhibit the following advantages.

According to the radio wave absorber and the producing method thereof in the present invention, the radio wave absorber can have excellent radio wave absorption characteristics (reflection loss characteristics), and can be easily produced. The present invention can eliminate the need of complicated producing steps, as required in the conventional radio wave absorbers, and the radio wave absorber can be easily produced only by making the conductive paint of the predetermined amount adhere to the one surface of the fiber bulk material by, for example, spraying.

Rather than making the conductive paint adhere to the entire fiber bulk material as in the conventional radio wave absorbers, the paint is made to adhere to only the obverse surface (the one surface) of the fiber bulk material, thereby resulting in reduction in the conductive paint used to lead to a reduction in weight and cost.

In addition, the absorber can be formed thinner than the conventional λ/4 type radio wave absorbers to approximately half in thickness. In other words, a thin radio wave absorber that is excellent in radio wave absorption characteristics can be produced, thereby leading to reduction in weight and cost and minimization of the space occupied by the radio wave absorber to thus enable effective utilization of indoor space.

| INDEX OF REFERENCE NUMERALS | |
|---|---|
| 1 | fiber bulk material |
| 1a | one surface |
| 2 | conductive surface |
| 5 | protection layer |
| 6 | conductive paint |
| 7 | spray |

BEST MODE FOR CARRYING OUT THE INVENTION

Embodiments of the present invention will be described below with reference to the accompanying drawings.

Figure 1:
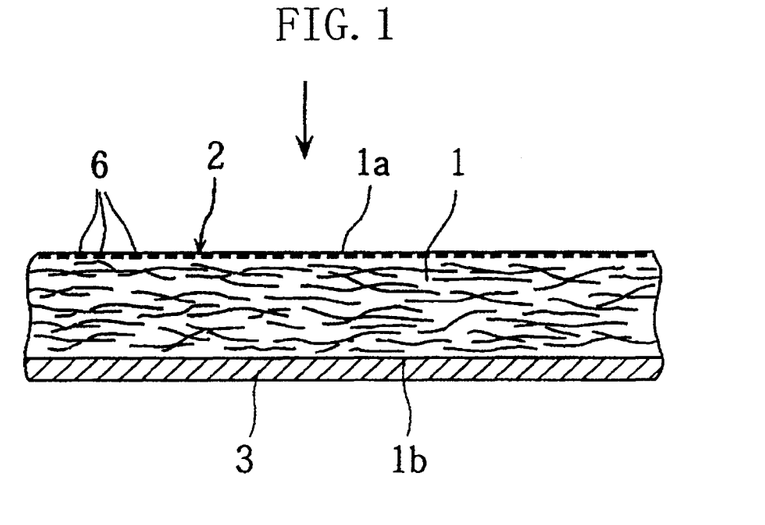
FIG. 1 is a sectional view schematically showing a configuration of a radio wave absorber in accordance with an embodiment of the present invention.

In FIG. 1, reference sign 1 denotes a mat-shaped (plate-shaped) inorganic fiber bulk material of a radio wave absorber in accordance with one embodiment. On its one surface 1a, the fiber bulk material 1 has a conductive surface 2 to which a conductive paint 6 adheres by spraying. Over the other surface 1b of the fiber bulk material 1, a metal reflecting plate 3 is laid. In the FIG. 1, the upper side (on the side of the one surface 1a) is a radio wave entering side.

As to the inorganic fiber bulk material 1, a material (non-flammable) in which multiple inorganic fibers are intertwined, such as glass wool, rock wool, ceramic wool, or the like, obtainable by a centrifugal method or a flame method is preferable in view of wide applicability for general purposes and low cost, when compared with a fiber bulk material obtained by processing continuous fiber (continuous glass fiber). Glass wool may be the most preferable in view of its light weight. In the present embodiment, the one surface 1a forming the conductive surface 2 of the fiber bulk material 1 is formed in an almost flat surface, but may be a rough surface on which multiple minute independent projections are formed.

The conductive paint 6 may be a graphite-based conductive paint (a conductive paint containing graphite), and is deposited thinly to adhere to fibers forming the surface (the one surface 1a) of the inorganic fiber bulk material 1. The conductive surface 2 is formed by drying the conductive paint 6 adhering to the one surface 1a.

Figure 2:
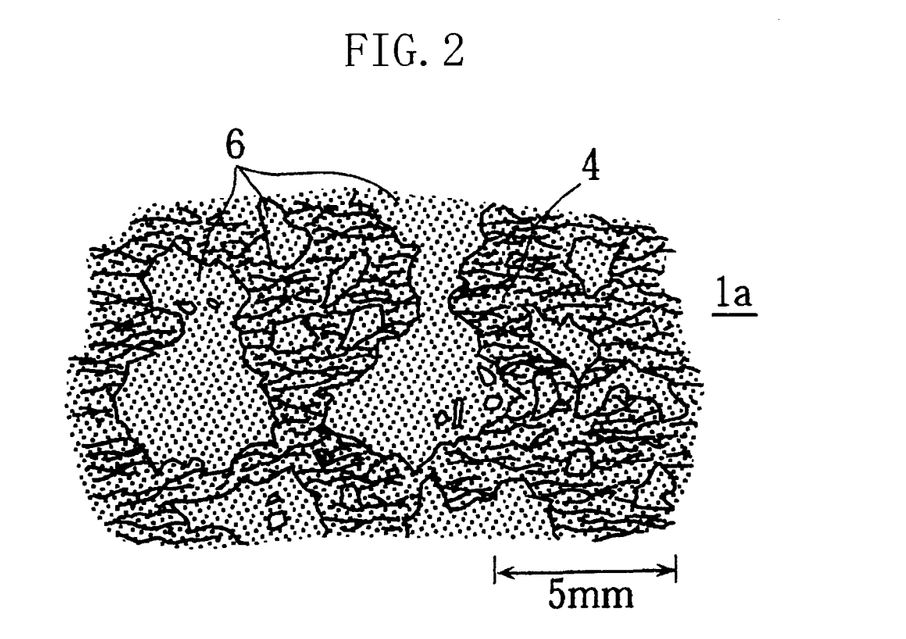
FIG. 2 is a plan view schematically showing in an enlarged scale a main part of the radio wave absorber.
Figure 3:
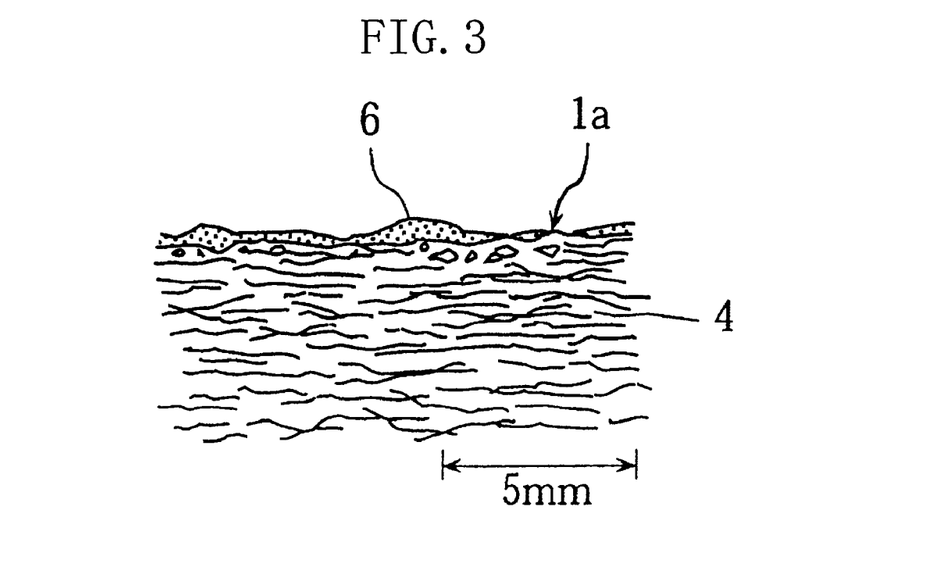
FIG. 3 is a sectional view schematically showing in an enlarged scale the main part of the radio wave absorber.

FIG. 2 is a main part enlarged plan view as viewed in the direction of the arrow in FIG. 1. FIG. 3 is a main part enlarged sectional view. FIG. 2 and FIG. 3 are views shown by enlarging approximately four times a sample of the radio wave absorber in accordance with the present embodiment.

As shown in FIG. 2, the conductive paint 6 adheres to the one surface 1a of the fiber bulk material 1 spottily, and multiple fibers 4 forming the fiber bulk material 1 are seen through the adhering conductive paint 6. In other words, the conductive paint 6 adheres to the one surface 1a non-uniformly in thickness, as shown in FIG. 3, and spots in independent or continuous "insular" shapes with predetermined or larger thicknesses are formed, as shown in FIG. 2. The fibers 4 are seen through parts smaller in thickness than the predetermined thickness.

The adhering amount q of the graphite-based conductive paint 6 to the one surface 1a is in the range between 5 g/m² and 60 g/m², both inclusive (5 g/m²≦q≦60 g/m²). The adhering amount q thereof is smaller than 5 g/m² (q<5 g/m²), which reduces radio wave reflection by the conductive surface 2, thereby attaining no desired reflection loss in the presence of influence of the reflecting plate 3; while on the other hand, the adhering amount q thereof is larger than 60 g/m² (60 g/m²<q), which increases radio wave reflection by the conductive surface 2 to attain no desired reflection loss. More preferably, the lower limit of the adhering amount q thereof is 10 g/m² or larger (10 g/m²≦q), while the upper limit thereof is 50 g/m² or smaller (q≦50 g/m²).

Other than the graphite-based (graphite, carbon black) conductive paint 6, a conductive paint of copper base, silver base, nickel base, aluminum base, or tin base may be employed, or any other conductive paint may be employed according to required radio wave absorption characteristics.

The resistance r between any two points 50 mm apart from each other on the conductive surface 2 is set in the range between 300Ω and 10 kΩ, both inclusive (300Ω≦r≦10 kΩ). When the resistance r between two arbitrary points 50 mm apart from each other on the conductive surface 2 is lower than 300Ω (r<300Ω), radio wave reflection by the conductive surface 2 increases to obtain no desired reflection loss; while when the resistance r is higher than 10 kΩ (10 kΩ<r), radio wave reflection by the conductive surface 2 reduces, thereby obtaining no desired reflection loss in the presence of influence of the reflecting plate 3. The resistance r between two points herein means a value measured in such a state that measurement terminals of a resistance measuring instrument are made in contact with the conductive surface 2 with 50 mm apart from each other. Preferably, the lower limit and the upper limit of the resistance r are 600Ω or higher (600Ω≦r) and 2 kΩ or lower (r≦2 kΩ), respectively.

Figure 4:
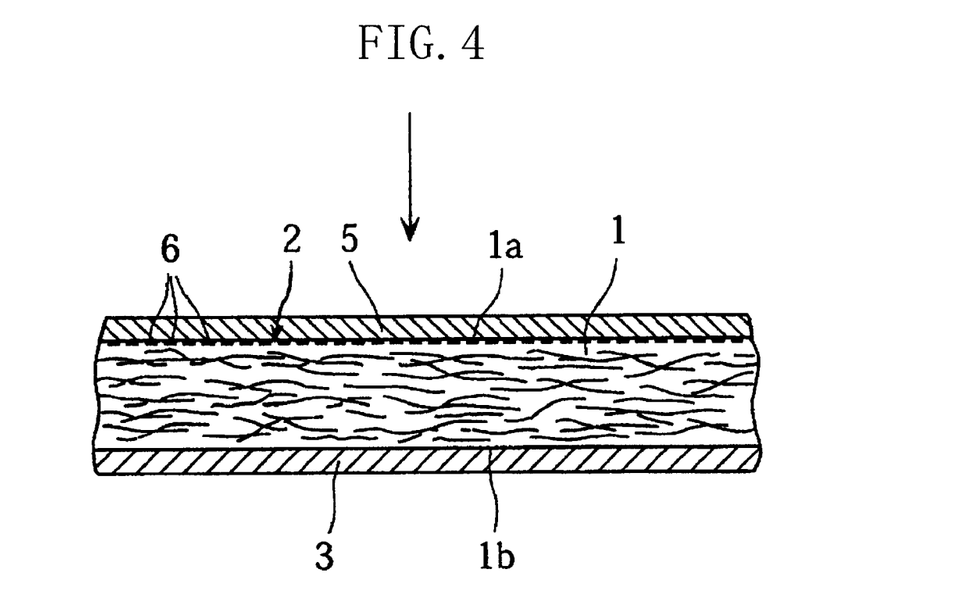
FIG. 4 is a sectional view showing a radio wave absorber of a modified example.

Referring to a modified example of one embodiment, as shown in FIG. 4, a protection layer 5 may be laid over the conductive surface 2 formed on the one surface 1a of the fiber bulk material 1. The protection layer 5 may be made of a material having weather resistance, water resistance, incombustibility, and the like. Specifically, the protection layer 5 is a sheet member of, for example, polyvinyl chloride (PVC), polyvinyl fluoride (PVF), or the like. Where the protection layer 5 is made to adhere to the conductive surface 2 by means of an adhesive, examples of the adhesive include an epoxy-based adhesive, a silicon-based adhesive, a denatured silicon based adhesive, and the like. The protection layer 5 may be formed by spraying or coating an acrylic paint, fluorine-based paint, or the like, onto the conductive surface 2. Alternatively, the protection layer 5 may be a bag-shaped member having weather resistance and the like, which covers the entirety of the fiber bulk material 1 including the conductive surface 2 (and the reflecting plate 3). As needed, the protection layer 5 may be colored with any desired color. In FIG. 4, the same reference numerals are assigned to the same components as in FIG. 1, and therefore, description thereof is omitted.

Next, a radio wave absorber producing method in accordance with one embodiment will be described.

Figure 5:
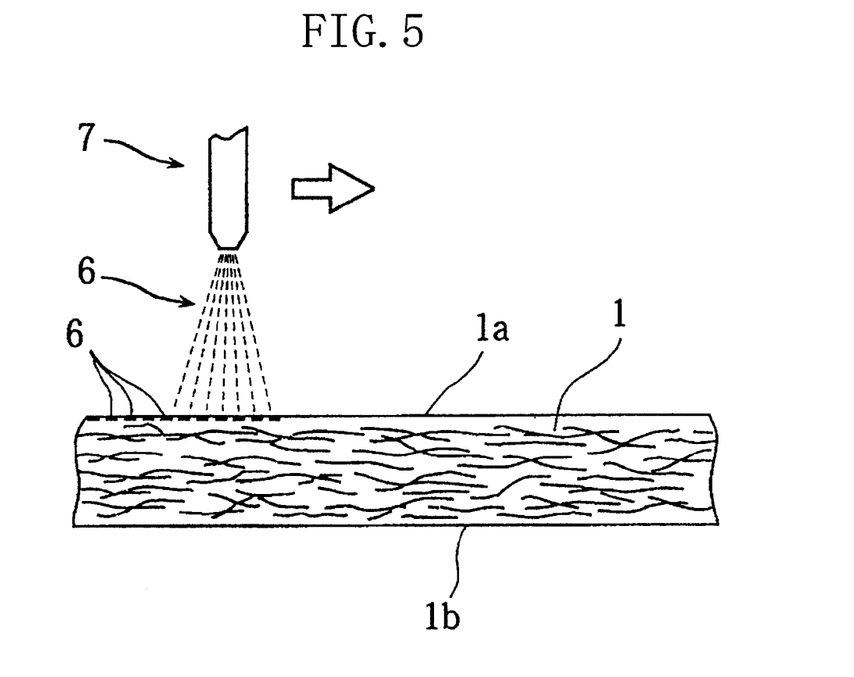
FIG. 5 is a sectional view schematically showing a conductive paint spraying step in a radio wave absorber producing method.

As shown in FIG. 5, the conductive paint 6 is sprayed by a spray 7 onto the one surface 1a of the mat-shaped inorganic fiber bulk material 1, so that a predetermined amount of the conductive paint 6 is caused to adhere thereto. In spraying, the conductive paint 6 is made to spottily adhere to the surface (the one surface 1a) of the fiber bulk material 1 to be non-uniform in thickness. In the case of using a graphite-based conductive paint 6, the adhering amount q thereof to the one surface 1a is in the range between 5 g/m$^2$ and 60 g/m$^2$, both inclusive (5 g/m$^2$≦q≦60 g/m$^2$). When the adhering amount q is smaller than 5 g/m$^2$ (q≦5 g/m$^2$), the electric resistance increases to impair the radio wave absorption effects. On the other hand, when the adhering amount q is larger than 60 g/m$^2$ (60 g/m$^2$<q), the electric resistance reduces to cause radio wave reflection, thereby impairing the radio wave absorption effects. Preferably, the lower limit of the adhering amount q is 10 g/m$^2$ or larger (10 g/m$^2$≦q) and the upper limit of the adhering amount q is 50 g/m$^2$ or smaller (q≦50 g/m$^2$), respectively.

Figure 6:
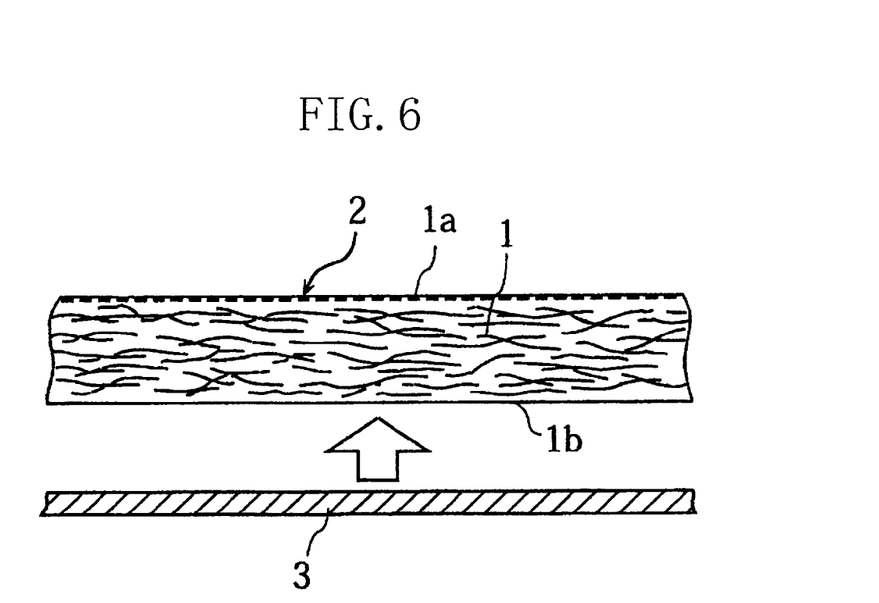
FIG. 6 is a view corresponding to FIG. 5 and schematically showing a reflecting plate overlaying step in the producing method.

As shown in FIG. 6, when the adhering conductive paint 6 is dried, the conductive surface 2 is formed. This conductive surface 2 is set to have a resistance r between two arbitrary points 50 mm apart from each other in the range between 300Ω and 10 kΩ, both inclusive (300Ω≦r≦10 kΩ). More preferably, the lower limit and the upper limit of the resistance r are 600Ω or higher (600Ω≦r) and 2 kΩ or lower (r≦2 kΩ), respectively.

Preferably, the paint 6 adheres and is distributed in the range between 0.5 mm and 2.5 mm, both inclusive (0.5 mm≦d≦2.5 mm), in depth d from the one surface 1a of the fiber bulk material 1 toward the center in the thickness direction (toward inside). When the paint 6 is distributed in the range smaller than 0.5 mm (d<0.5 mm) from the one surface 1a of the fiber bulk material 1 toward the center in the thickness direction or in the range larger than 2.5 mm (2.5 mm<d) from the one surface 1a toward the center in the thickness direction, appropriate adjustment of the electric resistance becomes difficult and can impair the radio wave absorption characteristics. Setting the upper limit to 1.5 mm or smaller (d≦1.5 mm) is preferable.

More specific description of the producing method will now be provided. As the fiber bulk material 1, glass wool may be used, which has a length of 1000 mm, a width of 1000 mm, a thickness of 15 mm, and a density of 35 kg/m$^3$. This glass wool is placed on a belt conveyer and is conveyed at a speed of 5 m/minute, while the conductive paint is sprayed onto one surface (upper surface) of the glass wool from the nozzle of an oscillating sprayer. Then, the glass wool is conveyed by the belt conveyer to pass through a drying furnace (approximately 20 m long) for drying the conductive paint, thereby forming the conductive surface 2 on the one surface of the glass wool.

As described above, in the producing method in accordance with one embodiment, the conductive paint 6 is sprayed by the sprayer 7 onto the one surface 1a of the inorganic fiber bulk material 1, and dried without being subjected to any paint pressing step. Namely, the conductive paint 6 sprayed on the one surface 1a of the fiber bulk material 1 is dried "as is" for forming the conductive surface 2 without being subjected to any paint pressing step, such as a step of uniformly spreading or plastering the conductive paint 6 sprayed on the one surface 1a of the fiber bulk material 1 by means of a pressing member, such as a roller, a spatula, or the like. In other words, the conductive paint 6 is not subjected to substantial pressing.

Thereafter, the metal-made reflecting plate 3 is laid over and made to adhere to the other surface 1b of the fiber bulk material 1, as shown in FIG. 6, thereby completing the radio wave absorber. The conductive paint 6 may be sprayed onto the fiber bulk material 1 after the reflecting plate 3 and the fiber bulk material 1 are overlaid with each other in advance.

The radio wave absorber thus produced is installed on an indoor wall or ceiling or as a partition for partitioning a room. Alternatively, the radio wave absorber may be interposed between interior materials, such as plaster boards for use as an inner wall material for a building. The ratio wave absorber may also be interposed between waterproof materials or materials subjected to waterproof treatment for use as an exterior wall material for a building.

Detailed description will be given below of measurements carried out for examining the radio wave absorption characteristics (reflection loss characteristics) of the radio wave absorbers of an example in accordance with one embodiment and a comparative example.

By way of example, an exemplary radio wave absorber ("Example") was produced by the same method as described above. Specifically, mat-shaped glass wool having a length of 1000 mm, a width of 1000 mm, a thickness of 15 mm, and a density of 32 kg/m$^3$ was used as the inorganic fiber bulk material 1. On the one surface 1a of the fiber bulk material 1, the conductive paint 6 obtained by mixing a conductive paint of three weight parts and water of one weight part is sprayed by the sprayer 7 at a discharge rate of 44 g/second for 120 seconds uniformly, and then, was heated and dried at 200° C. for four minutes without being pressed. The adhering amount of the conductive paint 6 to the one surface 1a was 40 g/m$^2$.

The adhering thickness of the conductive paint 6 thereto was distributed in the range between 0.5 mm and 1.5 mm, both inclusive, from the one surface 1a toward the center in the thickness direction.

Referring to a Comparative Example, similarly to Example of the present invention, the conductive paint 6 was sprayed onto the one surface 1a of the inorganic fiber bulk material 1. Thereafter, the surface to which the conductive paint 6 adheres was rolled uniformly with pressure by a plastic roller (75 mmφ), and was heated and dried at 200° C. for four minutes. The adhering amount of the conductive paint 6 to the one surface 1a was 40 g/m². The adhering thickness of the conductive paint 6 thereto was distributed in the range between 0.5 mm and 1.5 mm, both inclusive, from the one surface 1a toward the center in the thickness direction.

In sum, the paint was dried "as is" after being sprayed by the sprayer 7 (without being subjected to a paint pressing step) in the present invention, while rolling (a paint pressing step) was carried out after spraying, and was then dried in the Comparative Example. The reflecting plate 3 was laid over the other surface 1b of the fiber bulk material 1 in each of the Example of the present invention and the Comparative Example.

A reflection loss measurement was carried out on the Example and the Comparative Example by a reflection power method using a double-ridged waveguide horn antenna. The results are overlaid with each other in the graph of FIG. 7. In the graph, the solid line indicates the measurement result in the radio wave absorber of the Example, while the broken line indicates that of the Comparative Example. In the graph, the axis of abscissa indicates the frequency (unit: GHz) of the radio wave entering each radio wave absorber, while the axis of ordinates indicates the reflection loss (unit: dB).

Figure 7:
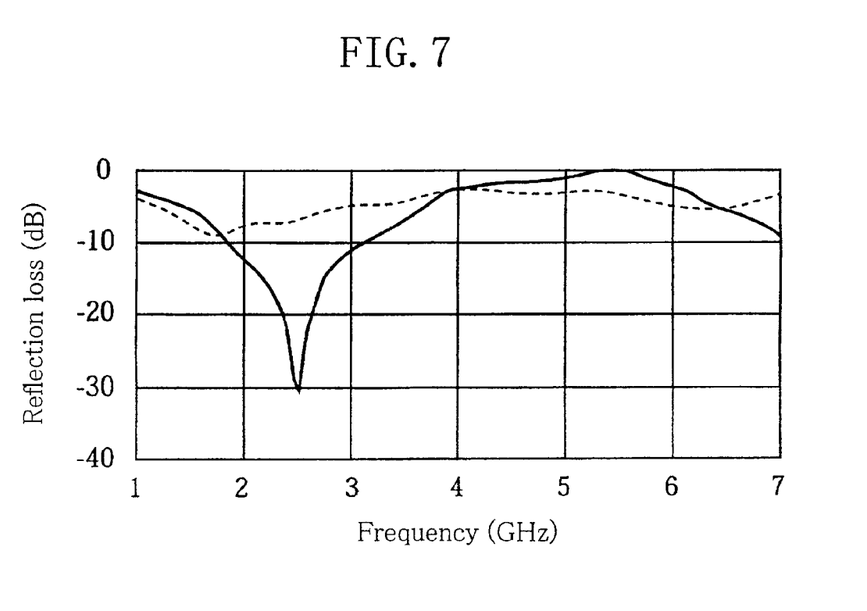
FIG. 7 is a graph showing, by way of example, each relationship between the frequency and the reflection loss by actual measurement of the radio wave absorbers.

The result in FIG. 7 proves that the Example (solid line) has reflection loss of which a peak value is −30 dB, which means exhibition of excellent radio wave absorption characteristics. In contrast, the Comparative Example (broken line) has reflection loss that does not reach −10 dB, which means poor radio wave absorption characteristics.

The radio wave absorption characteristics of the Comparative Example are worse than the characteristics of the Example due to the rolling by the roller after spraying by the sprayer 7 in the Comparative Example, which creates extended distributed (separate) spots of the conductive paint 6 to allow them to be combined with each other, thereby lowering the resistance of the surface (the conductive surface) to which the conductive paint 6 adheres (becoming excellent in conductivity). In this case, the resistance between two arbitrary points 50 mm apart from each other on the conductive surface in the Comparative Example was not set as in the conductive surface 2 in the Example, namely, was not in the range between 300Ω and 10 kΩ, both inclusive.

A plurality of samples of the radio wave absorber of the Example were produced with the thickness of the inorganic fiber bulk material 1 changed, and the matched frequency (as a frequency at a peak value of the reflection loss) of each sample was measured. The result was shown in FIG. 8.

Figure 8:
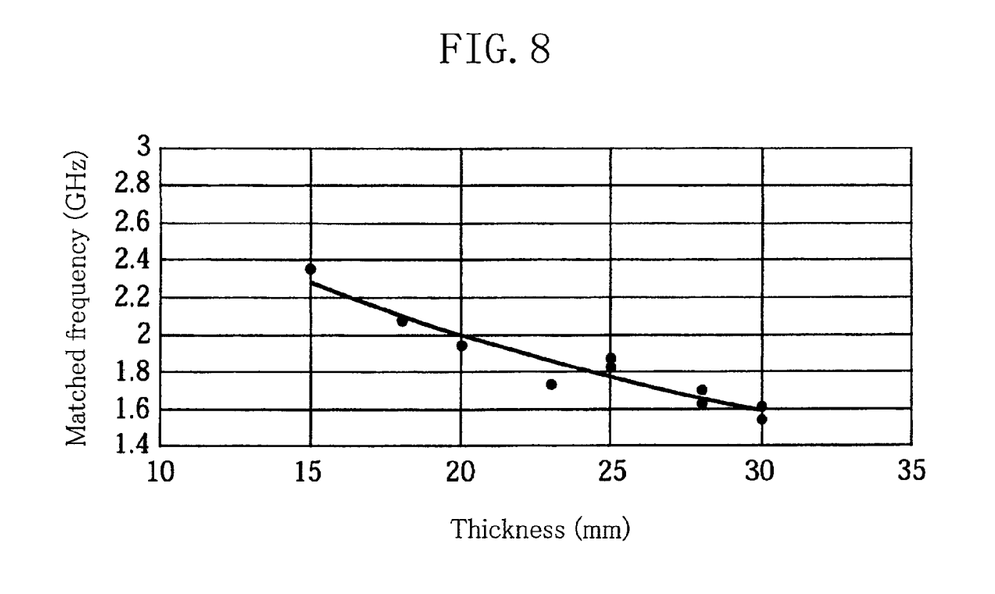
FIG. 8 is a graph showing, by way of example, a relationship between the thickness and the matched frequency of a mat-shaped inorganic fiber bulk material actually measured.

In FIG. 8, the axis of abscissa indicates the thickness (unit: mm) of the fiber bulk material 1, while the axis of ordinates indicates the matched frequency (unit: GHz). The data of the samples are plotted, and an approximate curve is drawn. As the thickness of the fiber bulk material 1 is increased, the matched frequency decreases.

The radio wave absorber of the Example is matched where the thickness thereof is approximately half of the conventional λ/4 type radio wave absorbers, in other words, where the thickness is approximately one-eighth of the wavelength.

The reason thereof will be examined in view of the transmission-line theory based on the configuration of the radio wave absorber and the actual measurement of the radio wave absorption characteristics.

The complex relative dielectric constant $\in$r1 of the glass wool (the fiber bulk material) used in the Example was determined as $\in$r1=1.52−j0.0 from the matched frequency of a radio wave absorber of one-quarter wavelength type using a resistance film having a surface resistance of 377Ω/□. In the glass wool of 15 mm in thickness, the thickness of the conductive surface 2 of the conductive paint was set at 1 mm, while the part to which the conductive paint does not adhere was set at 14 mm.

Figure 9:
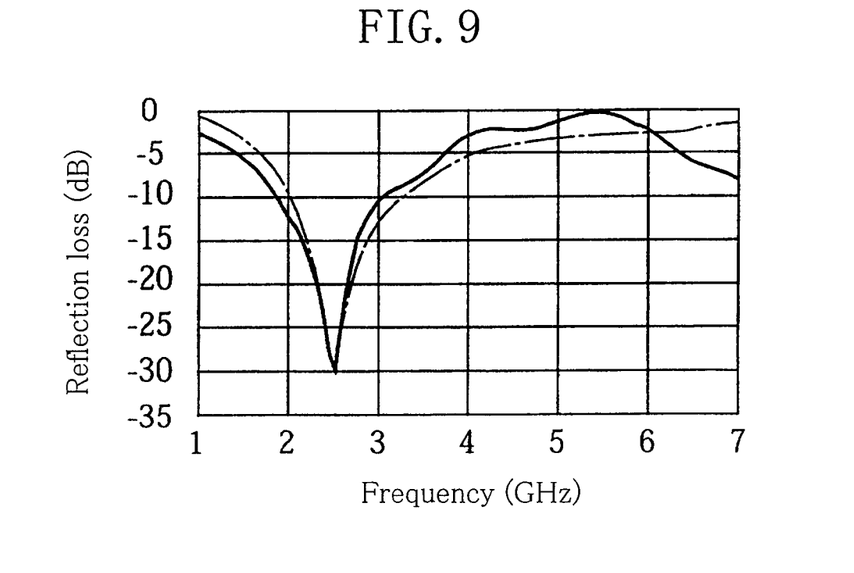
FIG. 9 is a graph showing, by way of example, both a relationship between the frequency and the reflection loss calculated on the assumption that a conductive surface is regarded as a dielectric loss material and a relationship between the frequency and the reflection loss actually measured.

In FIG. 9, the solid line indicates the measurement value (actual measurement value) of the reflection loss in the Example. The dashed line indicates data calculated on the assumption that the conductive surface 2 in the Example is regarded as a dielectric loss material. The calculation result on the assumption that the complex relative dielectric constant $\in$r2 of the conductive surface 2 is 19.5−j18.5 ($\in$r2=19.5−j18.5) approximates to the actual measurement value, as indicated in the FIG. 9.

Figure 10:
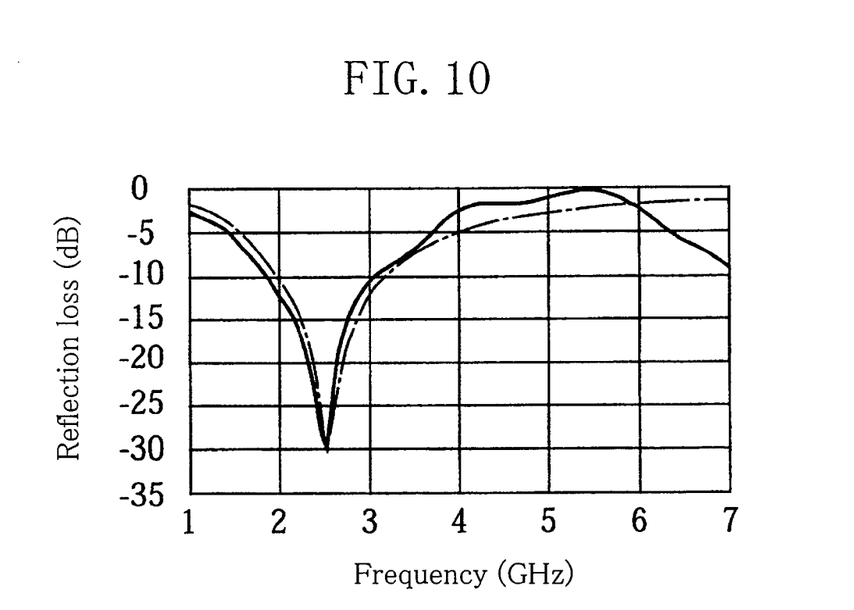
FIG. 10 is a graph showing, by way of example, both a relationship between the frequency and the reflection loss calculated on the assumption that the conductive surface is regarded as a combination of a dielectric and a resistance film and a relationship between the frequency and the reflection loss actually measured.

In FIG. 10, the solid line indicates the measurement value (actual measurement value) of the reflection loss in the Example, while the dashed line indicates data calculated by assuming that the conductive surface 2 in the Example is regarded as a combination of a dielectric and a resistance film. The calculation on the assumption that the complex relative dielectric $\in$r2 of the conductive surface 2 is 19.5−j0.0 ($\in$r2=19.5−j0.0) and the impedance of the resistance film is 377Ω/□, which is the free space impedance, and approximates to the actual measurement value, as indicated in the FIG. 10.

From the results in FIG. 9 and FIG. 10, the observation can be inferred that the conductive surface 2 serves as a dielectric loss material having a complex relative dielectric $\in$r2 of which the real part and the imaginary part contributing to the loss are 19.5 and 18.5, respectively, and can be also inferred in another aspect that the conductive surface 2 serves as a combination of a dielectric having a complex relative dielectric $\in$r2 of which the real part is 19.5 (the imaginary part is 0.0) and a resistance film having an impedance of approximately 377 Ω/□.

From the foregoing, while the present embodiment can serve as if provided as a ¼ wavelength type radio wave absorber, the conductive surface 2 having a thickness of approximately 1 mm has a large dielectric constant (real part), 19.5. Hence, the absorber may exhibit excellent radio wave absorption characteristics toward a radio wave having a matched frequency of 2.5 GHz and a wavelength of 120 mm. In this case, the radio wave absorber (Example) has a thickness of 15 mm, which is ⅛ (=15 mm/120 mm=0.125) of the wavelength of the radio wave having a matched frequency of 2.5 GHz and a wavelength of 120 mm. Namely, the thickness of the radio wave absorber in accordance with one embodiment is approximately one half of that of the conventional λ/4 (¼ wavelength) type radio wave absorbers.

Figure 11:
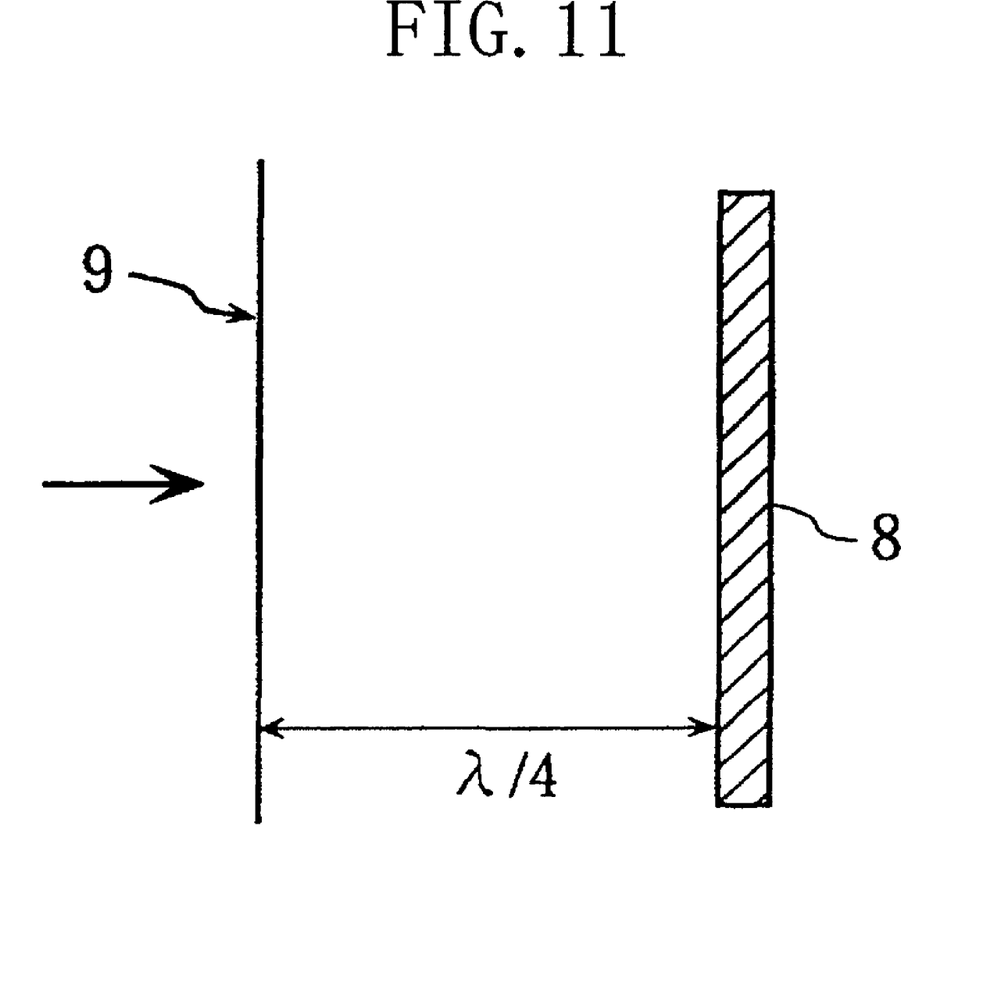
FIG. 11 is an explanatory illustration showing the principle of a conventional λ/4 type radio wave absorber.

The principal of the λ/4 type radio wave absorber will now be described herein.

Where a radio wave enters a metal plate (a reflecting plate) perpendicularly, a large standing wave is generated. The load impedance periodically reciprocates between zero and infinity, and the impedance at a point λ/4 (one-quarter wavelength) apart from the metal plate is infinite. As shown in FIG. 11, when the resistance film 9 having an impedance R is disposed λ/4 apart from the metal plate 8, the impedance at that point, which is a parallel synthesis of the impedance R of the resistance film 9 and the infinite impedance, is approximately equal to the impedance R. The reflection coefficient S at that point is expressed by the following equation where the free space impedance is Z:

$$S=(R-Z)/(R+Z)$$

When the impedance R of the resistance film 9 is set at a free space impedance of 377Ω/□, the reflection coefficient S is 0. In other words, the impedance R of the resistance film 9 agrees with the radio wave characteristics impedance of a dielectric intervening between the resistance film 9 and the metal plate 8. A material in which the thickness of the dielectric and the resistance film 9 are set is the λ/4 type radio wave absorber.

In contrast, the conductive surface 2 in the present invention might have a function of shifting the phase of a radio wave passing therethrough by a synthesis of a radio wave reflected by the reflecting plate 3 and a radio wave reflected by the conductive surface 2. Accordingly, shifting of the phase of a radio wave to be absorbed might allow the value of the load impedance of the fiber bulk material 1 not to be infinite at a point λ/4 apart from the reflecting plate 3 and to be infinite at a point λ/8 apart therefrom.

As described above, the radio wave absorber in accordance with the present embodiment includes the conductive surface 2 obtained by making the conductive paint 6 adhere to the one surface 1a of the mat-shaped inorganic fiber bulk material 1 by spraying the conductive paint 6 spottily, so as to be non-uniform in thickness, with a result that excellent radio wave absorption characteristics (reflection loss characteristics) can be exhibited with such a simple configuration. This step eliminates the need of complicated producing steps as required in the conventional radio wave absorbers, and the only required step is to spray the conductive paint 6 (of the predetermined amount) to adhere to the one surface 1a of the inorganic fiber bulk material 1 spottily, so as to be non-uniform in thickness, which is a simple method.

Unlike the conventional cases in which the conductive paint 6 is allowed to adhere to the entirety of the fiber bulk material 1, the conductive point 6 is allowed to adhere to only the obverse surface (the one surface) of the fiber bulk material 1, which reduces the conductive paint 6 used, thereby leading to reduction in weight and cost.

Further, the absorber can be thinner (approximately one-half) than the conventional λ/4 type radio wave absorbers. In other words, a thin radio wave absorber excellent in radio wave absorption characteristics can be produced. Hence, reduction in weight and cost can be contemplated, and the space that the radio wave absorber occupies can be minimized for effective utilization of indoor space.

The conductive surface 2 is obtained by spraying to make the conductive paint 6 adhere to the one surface 1a of the mat-shaped inorganic fiber bulk material 1, and the resistance r between two arbitrary points 50 mm apart from each other on the conductive surface 2 is set in the range between 300Ω and 10 kΩ, both inclusive (300Ω≦r≦10 kΩ). This simple configuration can exhibit excellent radio wave absorption characteristics (reflection loss characteristics). This arrangement eliminates the need of complicated producing steps as in the conventional radio wave absorbers, and a required step is only to spray to make the conductive paint 6 (of the predetermined amount) adhere to the one surface 1a of the inorganic fiber bulk material 1, which is a simple method.

A graphite-based conductive paint is used as the conductive paint 6, and the adhering amount q of the conductive paint 6 to the one surface 1a is set in the range between 5 g/m² and 60 g/m², both inclusive (5 g/m²≦q≦60 g/m²). This step can result in exhibition of excellent radio wave absorption characteristics.

Since the conductive paint 6 is allowed to adhere to the one surface 1a of the mat-shaped inorganic fiber bulk material 1, so as to be distributed in the range between 0.5 mm and 2.5 mm, both inclusive (0.5 mm≦d≦2.5 mm), in depth d from the one surface 1a toward the center in the thickness direction, excellent radio wave absorption characteristics can be exhibited. In the case where the conductive paint 6 is distributed in the range below 0.5 mm (d<0.5 mm) from the one surface 1a of the fiber bulk material 1 toward the center in the thickness direction or in the case where the conductive paint 6 is distributed in the range over 2.5 mm (2.5 mm<d) from the one surface 1a toward the center in the thickness direction appropriately adjusting the electric resistance can become difficult, and thus, impairs the radio wave absorption characteristics.

The mat-shaped inorganic fiber bulk material 1 is made of glass wool, rock wool, or ceramic wool, which means that the fiber bulk material 1 is made of inorganic fiber and excellent in fire resistance.

The fiber bulk material 1 is nonflammable to be excellent in fire resistance, and can therefore be safely installed in a living space, such as an office building, a residential house, or the like.

Overlaying the protection layer 5 with the conductive surface 2 can enhance the mechanical strength and durability (weather resistance) of the radio wave absorber. Further, the excellent radio wave absorption characteristics can be maintained for a long period of time with less or no damage received.

In the radio wave absorber producing method in accordance with the present embodiment, the conductive paint 6 is sprayed by the sprayer 7, so that the predetermined amount of the conductive paint 6 is allowed to adhere to the one surface 1a of the mat-shaped inorganic fiber bulk material 1, and the adhering the conductive paint 6 is dried to form the conductive surface 2 having a resistance r between two arbitrary points 50 mm apart from each other thereon in the range between 300Ω and 10 kΩ, both inclusive (300Ω≦r≦10 kΩ). Hence, a radio wave absorber having excellent radio wave absorption characteristics (reflection loss characteristics) can be produced easily. This arrangement eliminates the need of complicated producing processes as in the conventional radio wave absorbers, and a required step is only to spray to make the conductive paint 6 (of the predetermined amount) adhere to the one surface 1a of the inorganic fiber bulk material 1, which is a simple method.

Unlike the conventional cases in which the conductive paint 6 is allowed to adhere to the entirety of the fiber bulk material 1, the conductive paint 6 is allowed to adhere to only the obverse surface (one surface) of the fiber bulk material 1, which reduces the conductive paint 6 used, thereby leading to reduction in weight and cost.

Further, the absorber can be thinner (approximately one-half) than the conventional λ/4 type radio wave absorbers. In other words, a thin radio wave absorber excellent in radio wave absorption characteristics can be produced. Hence, reduction in weight and cost can be contemplated, and the space that the radio wave absorber occupies can be minimized for effective utilization of indoor space.

A graphite-based conductive paint as the conductive paint 6 is sprayed by the sprayer 7 to be allowed to adhere to the one surface 1a in the amount ranging between 5 g/m² and 60 g/m², both inclusive. This step can result in exhibition of excellent radio wave absorption characteristics.

Since the mat-shaped inorganic fiber bulk material 1 is substantially not pressed after the conductive paint 6 adheres thereto, the electric resistance of the one surface 1a (the conductive surface 2) to which the conductive paint 6 adheres can be set appropriately, thereby leading to exhibition of excellent radio wave absorption characteristics. In other words, the conductive paint 6 sprayed by the sprayer 7 adheres to the one surface 1a in a state of dispersed (separate) spots, so that the one surface 1a (the conductive surface 2) can be prevented from being too low in electric resistance (from being too excellent in conductivity) to lead to exhibition of excellent radio wave absorption characteristics.

The invention claimed is:

1. A radio wave absorber comprising:
a mat-shaped inorganic fiber bulk material; and
a conductive surface formed by making a conductive paint adhere spottily to one surface of the mat-shaped inorganic fiber bulk material in non-uniform thicknesses, the adhered conductive paint further comprising:
spots formed in the adhered conductive paint comprising such thickness of at least a predetermined depth and forming into one of an independent shape and a continuous insular shape; and
parts formed in the adhered conductive paint comprising such thickness less than the predetermined depth through which the fiber bulk material remains visible.

2. The radio wave absorber of claim 1,
wherein a resistance between two arbitrary points 50 mm apart form each other on the conductive surface is set in a range between 300Ω and 10 kΩ, both inclusive.

3. The radio wave absorber of claim 1, wherein
the conductive paint is a graphite-based conductive paint, and an adhering amount of the conductive paint to the one surface is set in a range between 5 g/m$^2$ and 60 g/m$^2$, both inclusive.

4. The radio wave absorber of claim 1, wherein
the conductive paint adheres to the one surface of the mat-shaped inorganic fiber bulk material to be distributed in the range between 0.5 mm and 2.5 mm, both inclusive, in depth from the one surface toward a center in the thickness direction.

5. The radio wave absorber of claim 1, wherein
the mat-shaped inorganic fiber bulk material is made of a material selected from the group consisting of glass wool, rock wool, and ceramic wool.

6. The radio wave absorber of claim 1, further comprising:
a protection layer laid over the conductive surface.

7. The radio wave absorber of claim 6, wherein
the protection layer is selected from the group consisting of weather resistant material, water resistant material, and incombustible material.

8. The radio wave absorber of claim 6, wherein
the protection layer adheres to the conductive paint of the mat-shaped inorganic fiber bulk material through one of an adhesive, spraying, coating, or a bag-shaped member.

9. The radio wave absorber of claim 1, wherein
the conductive paint adheres to less than an entirety of the mat-shaped inorganic fiber bulk material and the one surface of the mat-shaped inorganic fiber bulk material comprises an obverse surface.

10. A radio wave absorber producing method comprising:
spraying by a spray a conductive paint of a predetermined amount to adhere to one surface of a mat-shaped inorganic fiber bulk material; and
drying the adhering conductive paint without being subjected to any paint pressing step, wherein the conductive paint adheres in non-uniform thickness and comprises spots formed in the adhered conductive paint comprising such thickness of at least a predetermined depth and forming into one of an independent shape and a continuous insular shape, and parts formed in the adhered conductive paint comprising such thickness less than the predetermined depth through which the fiber bulk material remains visible, and a conductive surface having a resistance between two arbitrary points 50 mm apart from each other thereon in a range between 300Ω and 10 kΩ, both inclusive.

11. The method of claim 10, wherein
in the spraying, the conductive paint of graphite base is sprayed by the spray onto the one surface to adhere thereto to an amount in a range between 5 g/m$^2$ and 60 g/m$^2$, both inclusive.

12. The method of claim 10, wherein
during time from adhesion of the conductive paint to formation of the conductive surface, the mat-shaped inorganic fiber bulk material is not pressed substantially.

13. The method of claim 10, wherein
the conductive paint adheres to less than an entirety of the mat-shaped inorganic fiber bulk material and the one surface of the mat-shaped inorganic fiber bulk material comprises an obverse surface.

* * * * *